United States Patent
Wu

(10) Patent No.: US 9,946,294 B2
(45) Date of Patent: Apr. 17, 2018

(54) DOUBLE DATA RATE GATING METHOD AND APPARATUS WITH REAL-TIME DETECTION CAPABILITY FOR PERFORMING GATING TO IMPROVE THE EFFICIENCY OF MEMORY ACCESS CONTROL

(71) Applicant: Faraday Technology Corp., Hsin-Chu (TW)

(72) Inventor: Chih-Hung Wu, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 112 days.

(21) Appl. No.: 15/046,425

(22) Filed: Feb. 17, 2016

(65) Prior Publication Data

US 2017/0097654 A1    Apr. 6, 2017

(30) Foreign Application Priority Data

Oct. 2, 2015   (TW) .............................. 104132477 A

(51) Int. Cl.
*G11C 8/00* (2006.01)
*G06F 1/06* (2006.01)
*G06F 3/06* (2006.01)

(52) U.S. Cl.
CPC ............. *G06F 1/06* (2013.01); *G06F 3/0611* (2013.01); *G06F 3/0653* (2013.01); *G06F 3/0673* (2013.01)

(58) Field of Classification Search
None
See application file for complete search history.

(56) References Cited

U.S. PATENT DOCUMENTS

| 2009/0125767 | A1* | 5/2009 | Linzer .............. G01R 31/31855 714/727 |
| 2015/0279447 | A1 | 10/2015 | Koshizuka |
| 2017/0110175 | A1* | 4/2017 | Kim .................... G11C 11/4093 |

* cited by examiner

*Primary Examiner* — Harry W Byrne
*Assistant Examiner* — Sultana Begum
(74) *Attorney, Agent, or Firm* — Winston Hsu

(57) ABSTRACT

A Double Data Rate (DDR) gating method is applied to a memory controller of an associated DDR gating apparatus. The DDR gating method includes: outputting from the memory controller an outward clock signal to a memory, and receiving from the memory a backward clock signal corresponding to the outward clock signal, wherein the backward clock signal is utilized as reference for a data read operation of the memory controller with respect to the memory; and providing an input stage of the memory controller with a reference signal to generate, through single ended receiving of the input stage, gating-related information for performing gating when sampling the backward clock signal, and lengthening time of a preamble of the backward clock signal with aid of the single ended receiving of the input stage, for increasing a detection margin of the preamble.

18 Claims, 8 Drawing Sheets

US 9,946,294 B2

DOUBLE DATA RATE GATING METHOD AND APPARATUS WITH REAL-TIME DETECTION CAPABILITY FOR PERFORMING GATING TO IMPROVE THE EFFICIENCY OF MEMORY ACCESS CONTROL

CROSS REFERENCE TO RELATED APPLICATION

This application is based upon and claims the benefit of the priority from the prior Taiwan Patent Application No. 104132477, which was filed on Oct. 2, 2015.

BACKGROUND OF THE INVENTION

1. Field of the Invention

The present invention relates to memory access control, and more particularly, to a double data rate (DDR) gating method and an associated DDR gating apparatus.

2. Description of the Prior Art

A conventional memory controller used for DDR memories often encounters problems. The memory controller needs an additional postamble closure circuit to terminate the gating of a data strobe signal. The preamble detection margin of the conventional memory controller is short, e.g. only 1T in duration. Therefore, the conventional memory controller lacks real-time detection capability for performing gating. There is a need for a novel method to improve the efficiency of memory access control.

SUMMARY OF THE INVENTION

An objective of the present invention is to provide a double data rate (DDR) gating method and an associated DDR gating apparatus which can solve the above problem.

Another objective of the present invention is to provide a DDR gating method and an associated DDR gating apparatus which can improve the efficiency of memory access control.

A preferred embodiment of the present invention provides a DDR gating method. The DDR gating method is applied to a memory controller, and comprises: outputting an outward clock signal to a memory from the memory controller, and receiving a backward clock signal corresponding to the outward clock signal from the memory, wherein the backward clock signal is utilized as reference for a data reading operation of the memory controller with respect to the memory; and providing a reference signal to an input stage of the memory controller to generate gating-related information through single ended receiving of the input stage for performing gating when sampling the backward clock signal, and lengthening a preamble of the backward clock signal with aid of the single ended receiving of the input stage for increasing a detection margin of the preamble.

A preferred embodiment of the present invention provides a DDR gating apparatus. The DDR gating apparatus comprises at least one portion of an electronic device, and comprises a memory controller. The memory controller is arranged to control a memory, wherein the memory controller and the memory are installed in an electronic device. The memory controller comprises an input stage, an access control circuit and a margin control circuit. The input stage is arranged to receive at least one signal. The access control circuit is coupled to the input stage, and arranged to output an outward clock signal to a memory from the memory controller, wherein the access control circuit controls the input stage to receive a backward clock signal corresponding to the outward clock signal from the memory, and the backward clock signal is used as reference for a data reading operation of the memory controller upon the memory. The margin control circuit is coupled to the input stage and the access control circuit, and arranged to provide a reference signal to the input stage to generate gating-related information through single ended receiving of the input stage for performing gating when sampling the backward clock signal, and lengthening a preamble of the backward clock signal with aid of the single ended receiving of the input stage for increasing a detection margin of the preamble.

The DDR gating method and apparatus of the present invention may improve the efficiency of memory access control. The DDR gating method and DDR gating apparatus of the present invention may increase the preamble detection margin, and may provide real-time detection for some types of memories (e.g. LPDDR3 memories), wherein the DDR gating method and DDR gating apparatus of the present invention do not need to use an additional postamble closure circuit. Compared with related arts, the DDR gating method and DDR gating apparatus of the present invention may improve the efficiency of an electronic device without introducing unwanted side effects. More particularly, the electronic device implemented with the DDR gating method and the DDR gating apparatus of the present invention will not encounter issues such as the overall hardware structure is too large or too complicated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
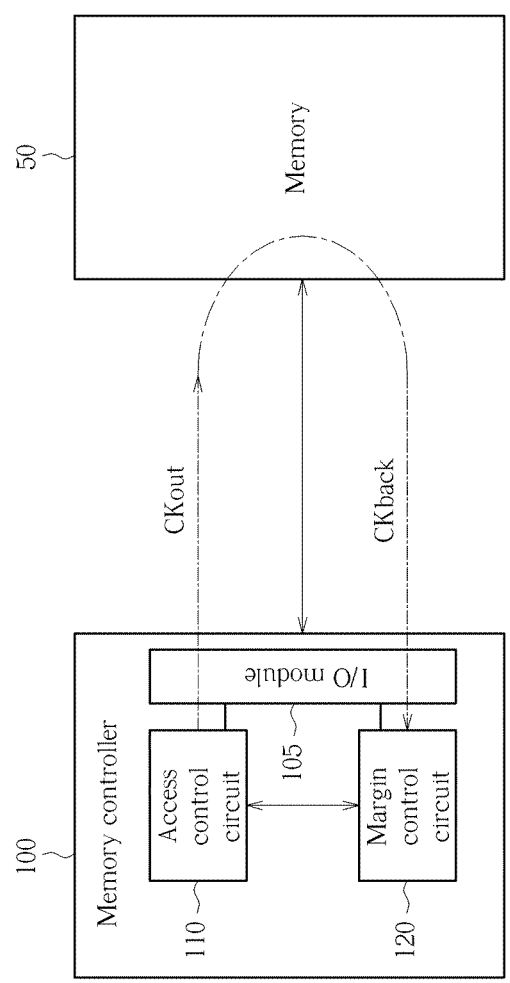
FIG. 1 is a diagram illustrating a DDR gating apparatus according to a first embodiment of the present invention.

FIG. 1 is a diagram illustrating a DDR gating apparatus according to a first embodiment of the present invention, wherein the DDR gating apparatus may comprise at least one portion (e.g. part or all) of an electronic device. For example, the DDR gating apparatus may comprise a control circuit of the electronic device, such as a control circuit implemented with an integrated circuit (IC). In another example, the DDR gating apparatus may comprise the entire electronic device, such as the electronic device itself. In another example, the DDR gating apparatus may comprise a system of the electronic device, such as a computer system. Examples of the electronic device may comprise, but are not limited to, a personal computer, external storage equipment, or a module inside a personal computer.

As shown in FIG. 1, the DDR gating apparatus may comprise a memory controller 100 arranged to control a memory 50, such as a DDR double data rate synchronous dynamic random access memory (DDR SDRAM), wherein the memory controller 100 and the memory 50 are installed in the electronic device. The memory controller 100 and the memory 50 may be integrated in a semiconductor chip. More particularly, a plurality of terminals of an input/output (I/O) module 105 of the memory controller 100 may be coupled to a plurality of terminals of an I/O module of the memory 50, respectively. Various types of DDR SDRAM are DDR2, DDR3, DDR4, LPDDR2, and LPDDR3, wherein "LP" represents low power. Since the above techniques can be realized by referring to their associated specifications, the detailed descriptions thereof are omitted here.

According to this embodiment, the memory controller 100 comprises: an input stage, located in the I/O module 105; an access control circuit 110, coupled to the input stage; and a margin control circuit 120, coupled to the input stage and the access control circuit 110. The input stage is arranged to receive at least one signal. Further, the access control circuit 110 may perform access control for the memory 50, and may control the input stage for performing access control. In addition, the margin control circuit 120 may perform margin control for at least one signal from the memory 50, and may control the input stage for performing margin control.

Figure 2:
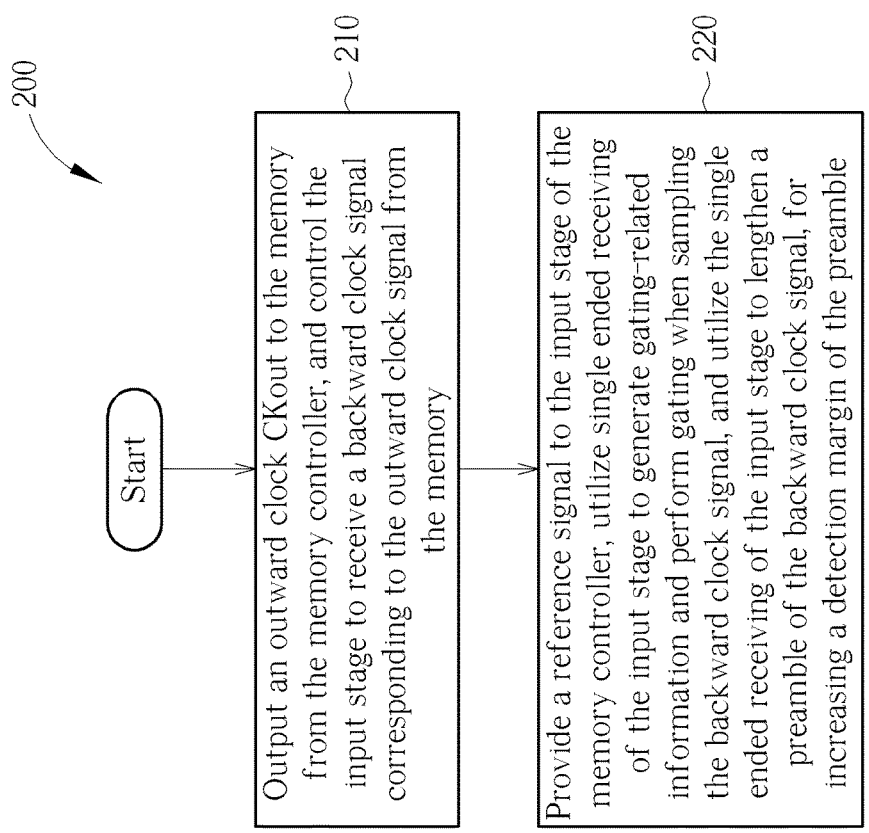
FIG. 2 is a flowchart illustrating a DDR gating method according to an embodiment of the present invention.

FIG. 2 is a flowchart illustrating a DDR gating method 200 according to an embodiment of the present invention. The DDR gating method 200 may be applied to the memory controller 100 shown in FIG. 1. Under the control of the memory controller 100, the DDR gating apparatus may perform the steps shown in FIG. 2. The DDR gating method 200 is described as follows.

In Step 210, the access control circuit 110 outputs an outward clock signal CKout to the memory 50 from the memory controller 100, and controls the input stage to receive a backward clock signal CKback corresponding to the outward clock signal CKout from the memory 50, wherein the backward clock signal CKback is used as reference for a data reading operation of the memory controller with respect to the memory 50.

In Step 220, the margin control circuit 120 provides a reference signal to the input stage of the memory controller 100, and utilizes single ended receiving of the input stage to generate gating-related information and perform gating when sampling the backward clock signal CKback. The margin control circuit 120 utilizes the single ended receiving of the input stage to lengthen a preamble of the backward clock signal CKback, for increasing a detection margin of the preamble.

The backward clock signal CKback from the memory 50 may be implemented as a set of differential data strobe signals, and the memory controller 100 may obtain a received data strobe signal through differential receiving, wherein sampling the backward clock signal CKback may be implemented by sampling the received data strobe signal. Further, the memory controller 100 may obtain another received data strobe signal through the single ended receiving of the input stage, wherein the other received data strobe signal carries the gating-related information.

The operations illustrated in Steps 210 and 220 are for illustrative purposes, and not meant to be a limitation of the present invention. According to a modification of this embodiment, the work flow may be changed. For example, at least one portion of operations in Steps 210 and/or Step 220 may be performed repeatedly. In another example, at least one portion of operations of Step 210 and Step 220 may be performed concurrently.

According to some embodiments, the margin control circuit 120 may generate at least one gating signal to increase the detection margin of the preamble. More particularly, according to the aforementioned at least one gating signal, the margin control circuit 120 may perform gating upon the backward clock signal CKback (e.g. the aforementioned data strobe signal), to generate a filtered backward clock signal for providing a reference for the data reading operation. According to the aforementioned gating signal, the margin control circuit 120 may perform gating upon the backward clock signal CKback to prevent any unknown state within a plurality of logic states of the backward clock signal CKback from appearing in the filtered backward clock signal. In another example, when performing the data reading operation, the memory controller 100 may sample a data signal from the memory 50 according to the filtered backward clock signal to obtain data.

According to some embodiments, the margin control circuit 120 may perform at least one oversampling operation upon the backward clock signal CKback to trace the first edge of the backward clock signal CKback after the preamble, in order to complete real-time tracing of the backward clock signal CKback. For example, the margin control circuit 120 may select a set of oversampling points from a plurality of candidate oversampling points, wherein the set of oversampling points is a plurality of successive oversampling points within the plurality of candidate oversampling points. The margin control circuit 120 may perform a set of oversampling operations respectively corresponding to the set of oversampling points to obtain a set of sampling results respectively corresponding to the set of oversampling points. In addition, according to the set of sampling results, the margin control circuit 120 may selectively update the set of oversampling points as a set of updated oversampling points, wherein the set of updated oversampling points may be a plurality of successive oversampling points within the plurality of candidate oversampling points, and a portion of oversampling points within the set of updated oversampling points may be equal to a portion of oversampling points within the set of oversampling points. In some embodiments, the set of oversampling points may comprise a target oversampling point (which is within of the plurality of candidate oversampling points), and may further comprise at least two subsequent oversampling points (which are within the plurality of candidate oversampling points), wherein the target oversampling point may be arranged to lock the first edge of the backward clock signal CKback after the preamble.

According to some embodiments, the margin control circuit 120 may perform the oversampling operation upon the backward clock signal CKback to trace the first edge of the backward clock signal CKback after the preamble, rather than using any dummy input/output (I/O) output cell to lock the backward clock signal CKback. In this way, the additional operation of adding the dummy I/O cell in the memory controller 100 for locking the backward clock signal CKback can be saved. Compared with the conventional memory controller which generally requires a set of dummy I/O cells, the present invention may greatly reduce the chip area of the memory controller 100, thus reducing related cost.

Figure 3:
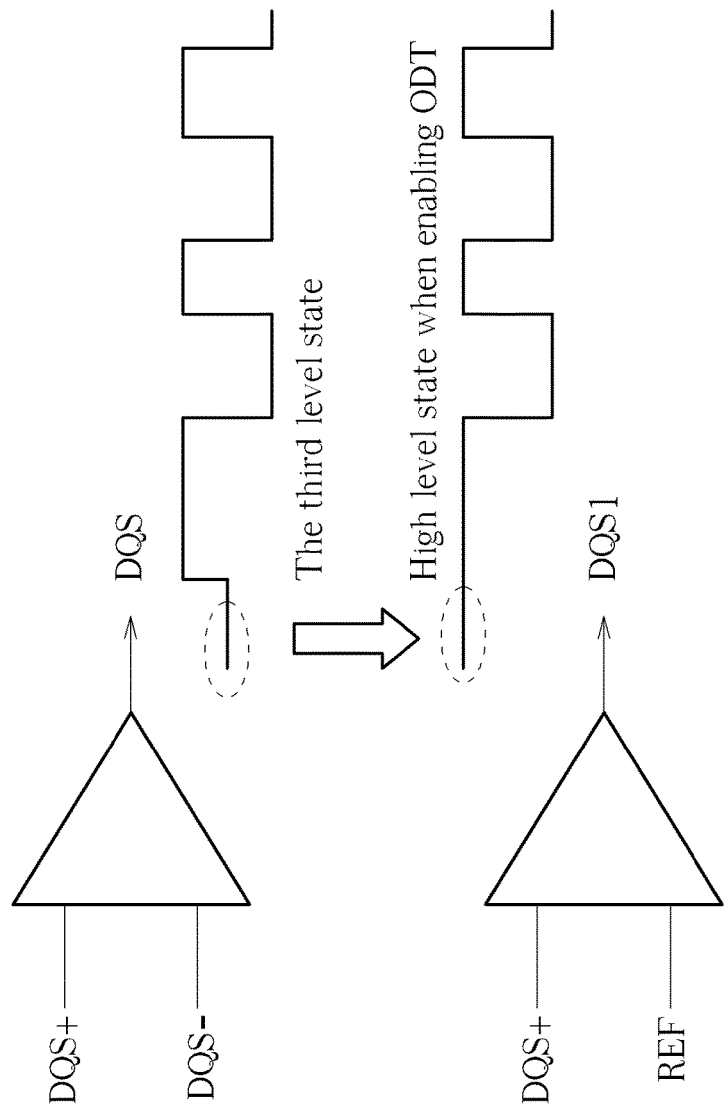
FIG. 3 is a diagram illustrating a backward clock gating scheme of the DDR gating method shown in FIG. 2 according to an embodiment of the present invention.

FIG. 3 is a diagram illustrating a backward clock gating scheme of the DDR gating method shown in FIG. 2 according to an embodiment of the present invention, wherein the backward clock gating scheme may be applied to the aforementioned DDR SDRAM conforming to DDR4. The receiver shown in the bottom-left corner of FIG. 3 may be an example of the input stage mentioned in Step 220, and the receiver shown in the top-left corner of FIG. 3 may be an example of another input stage in the I/O module 105. The set of differential data strobe signals DQS+ and DQS− shown in the top-left corner of FIG. 3 may be an example of the aforementioned set of differential data strobe signals, and the reference signal REF shown in the bottom-left corner of FIG. 3 may be an example of the reference signal mentioned in Step 220.

As shown in FIG. 3, the set of differential data strobe signals DQS+ and DQS− may be converted into the data strobe signal DQS (which may be an example of the received data strobe signal) through the receiver shown in the top-left corner of FIG. 3. Note that if the set of differential data strobe signals DQS+ and DQS− is processed through differential receiving only, the set of differential data strobe signals DQS+ and DQS− will be limited at a third state in the beginning of the data strobe signal DQS, which is an unknown state between a high level state and a low level state. In order to obtain the gating-related information mentioned in Step 220, one of the set of differential data strobe signals DQS+ and DQS− (such as the data strobe signal DQS+) may be converted into the data strobe signal DQS1 (which may be an example of the other received data strobe signal) shown in the bottom-right corner of FIG. 3 through the receiver shown in the bottom-left corner of FIG. 3, wherein the reference signal REF may has a fixed level. Thereby, the single ended receiving mentioned in Step 220 can be implemented.

According to this embodiment, the on-die termination (ODT) technique may be applied to data strobe signal gating (also called DQS gating). For example, through enabling an ODT resistor of the input stage mentioned in Step 220, the margin control circuit 120 may convert the unknown state into a high level state, to lengthen the preamble of the backward clock signal CKback.

The partial waveform prior to the first edge of the entire waveform at the bottom-right corner of FIG. 3 may represent the preamble. By making the partial wave totally correspond to the high level state, the margin control circuit 120 may lengthen the preamble of the backward clock signal CKback with the aid of the single ended receiving of the input stage, to increase the detection margin of the preamble. Compared with the waveform shown in the top-right corner of FIG. 3, the preamble in the waveform shown in the bottom-right corner of FIG. 3 is lengthened. This is because the memory controller 100 may refer to the data strobe signal DQS1 to perform gating upon the data strobe signal DQS, rather than only referring to the deviation signal of the data strobe signal DQS. The gating performed upon the data strobe signal DQS by the memory controller 100 will not be limited by the third level state which appears in the beginning of the data strobe signal DQS. Some features in this embodiment similar to those in the previous embodiments/modifications are omitted here for brevity.

Figure 4:
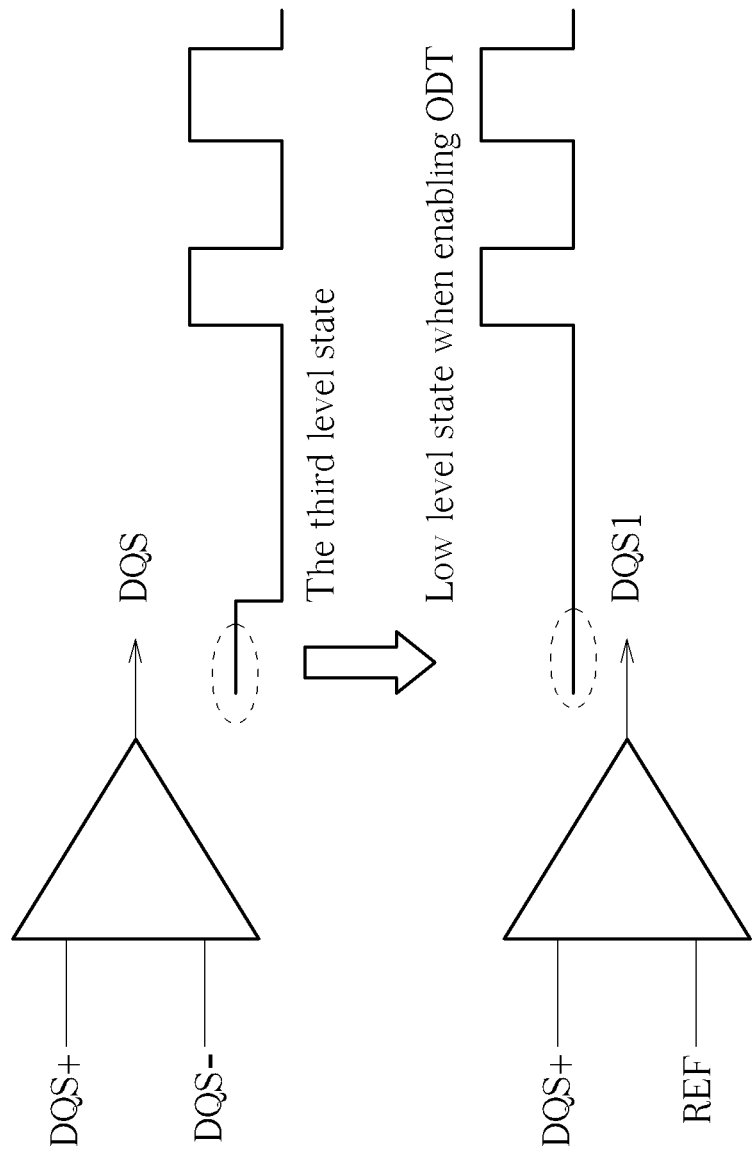
FIG. 4 is a diagram illustrating a backward clock gating scheme of the DDR gating method shown in FIG. 2 according to another embodiment of the present invention.

FIG. 4 is a diagram illustrating a backward clock gating scheme of the DDR gating method shown in FIG. 2 according to another embodiment of the present invention, wherein the backward clock gating scheme of this embodiment may be applied to the DDR SDRAMs conforming to LPDDR2 and LPDDR3. The two receivers in the left side may be identical to those in the left side of FIG. 3. Compared with embodiments shown in FIG. 3, the preamble of the data strobe signal DQS defined in this embodiment is modifiable.

As shown in FIG. 4, the set of differential data strobe signals DQS+ and DQS− may be converted into the data strobe signal DQS shown in the top-right corner of FIG. 4 (which may be an example of the received data strobe signal) through the receiver shown in the top-left corner of FIG. 4.

In this embodiment, the data strobe signal DQS has a high level state, a low level state and a third level state as mentioned above. The preamble of the data strobe signal DQS begins with the low level state, rather than beginning with the high level state and then entering the low level state. In order to obtain the gating-related information mentioned in Step 220, one of the set of differential data strobe signals DQS+ and DQS− (such as the data strobe signal DQS+) may be converted into the data strobe signal DQS1 shown in the bottom-right corner of FIG. 4 (which may be an example of the other received data strobe signal) through the receiver shown in the bottom-left corner of FIG. 4.

In some embodiments, such as the embodiment shown in FIG. 3, the aforementioned ODT technique may be applied to the aforementioned DQS gating. This is merely for illustrative purposes, and not meant to be a limitation of the present invention. According to some embodiments of the present invention, such as the embodiment shown in FIG. 4, the memory controller 100 may use an additional set of pull up and pull down resistors, such as a pull up resistor and a pull down resistor, to perform the DQS gating. For example, the input stage mentioned in Step 220 may comprise the set of pull up and pull down resistors. By enabling a specific resistor within the set of pull up and pull down resistors (e.g. the pull down resistor), the margin control circuit 120 may convert this unknown state into the low level state to lengthen the preamble of the backward clock signal CKback. Note that the waveform shown in the bottom-right corner of FIG. 4 may represent the preamble. By making the partial waveform correspond to the low level state, the margin control circuit 120 may lengthen the preamble of the backward clock signal CKback through the single ended receiving of the input stage, for increasing the detection margin of the preamble. Compared with the waveform shown in the top-right corner of FIG. 4, the preamble of the waveform shown in the bottom-right corner of FIG. 4 is lengthened. Some features in this embodiment similar to those in the previous embodiments/modifications are omitted here for brevity.

Figure 5:
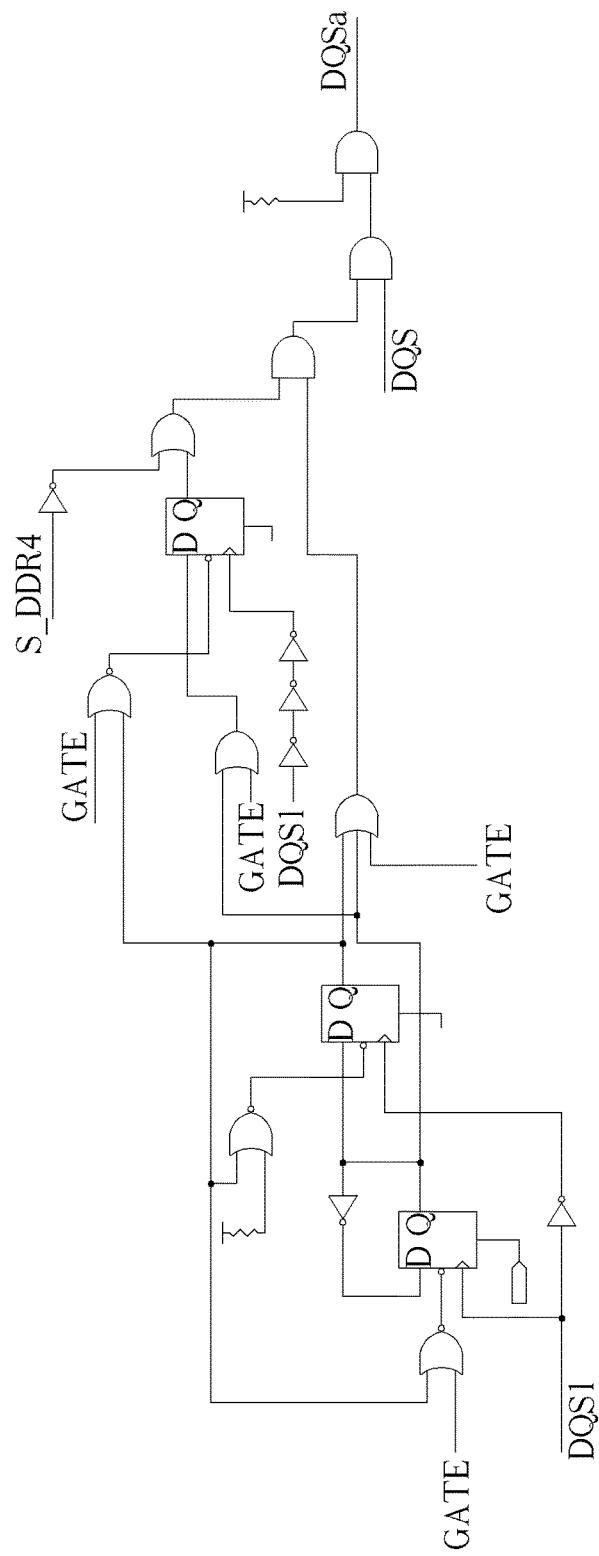
FIG. 5 is a diagram illustrating a gating module of the margin control circuit shown in FIG. 1 according to an embodiment of the present invention.

FIG. 5 is a diagram illustrating a gating module of the margin control circuit 120 shown in FIG. 1 according to an embodiment of the present invention, wherein the gating module may comprise a plurality of logic gates and some predetermined logic levels. One of the predetermined logic levels may represent a predetermined logic value 1 or a predetermined logic value 0. The data strobe signal DQS shown in the right part of FIG. 5 may be an example of the backward clock signal CKback mentioned in Step 220, and the data strobe signal DQSa shown in the right part of FIG. 5 may be an example of the filtered backward clock signal. In addition, the type selection signal S_DDR4 may be arranged to selectively enable or disable a portion of elements of the gating module, to make the gating module applicable to various types of DDR SDRAMs. For example, when the type selection signal S_DDR4 is set as the predetermined logic value 1, the gating module is applicable to the DDR SDRAM conforming to DDR4, wherein the backward clock gating scheme shown in FIG. 3 may be applied to the memory controller 100, and the data strobe signals DQS and DQS1 shown in FIG. 3 may be used as the data strobe signals DQS and DQS1 shown in FIG. 5, respectively. In another example, when the type selection signal S_DDR4 is set as the predetermined logic value 0, the gating module is applicable to the DDR SDRAMs conforming to the LPDDR2 and LPDDR3, wherein the backward clock gating scheme shown in FIG. 4 may be applied to the memory controller 100, and the data strobe signals DQS and DQS1 shown in FIG. 4 may be used as the data strobe signals DQS and DQS1 shown in FIG. 5, respectively.

According to this embodiment, the margin control circuit 120 may comprise the gating module, and the gating module may be arranged to perform gating upon the backward clock signal CKback (e.g. the data strobe signal), to generate the filtered backward clock signal as a reference for the data reading operation. Note that the preamble of the backward clock signal CKback in this embodiment is lengthened after the operations in Step 220 are performed. Regarding the aforementioned DQS gating, the original source of the gating signal GATE may adopt conventional designs, and can be further modified with the lengthening operation mentioned in Step 220. For example, the length of a specific "gate open time interval" of the gating signal GATE may correspond to one or more specific predetermined parameters of the outward clock signal CKout, wherein the term "gate open" can be taken as allowing a gated object to pass. A gating signal adjustment module (not shown in FIG. 5) of the margin control circuit 120 may dynamically adjust the gating signal GATE, so that the gating signal GATE can be applicable to the gating module shown in FIG. 5. For example, the gating signal adjustment module may selectively adjust the start time of the gate open time interval of the gating signal GATE according to the gating-related information, and more particularly, dynamically shift the gating signal GATE along the time axis for the gating module. Through utilizing the gating module, the margin control circuit 120 may increase the gating area of the data strobe signal DQS, thereby not only increasing the detection margin of the preamble via the margin control circuit 120 (as mentioned in Step 220), but also completely obtaining a series of pulses of the backward clock signal CKback (e.g. the data strobe signal DQS). In some embodiments, as long as the targets of "increasing the detection margin of the preamble" and "completely obtaining a series of pulses of the backward clock signal CKback" can be achieved, some implementation details may be modified. For example, the gating signal adjustment module may be implemented as a portion of the gating module.

Figure 6:
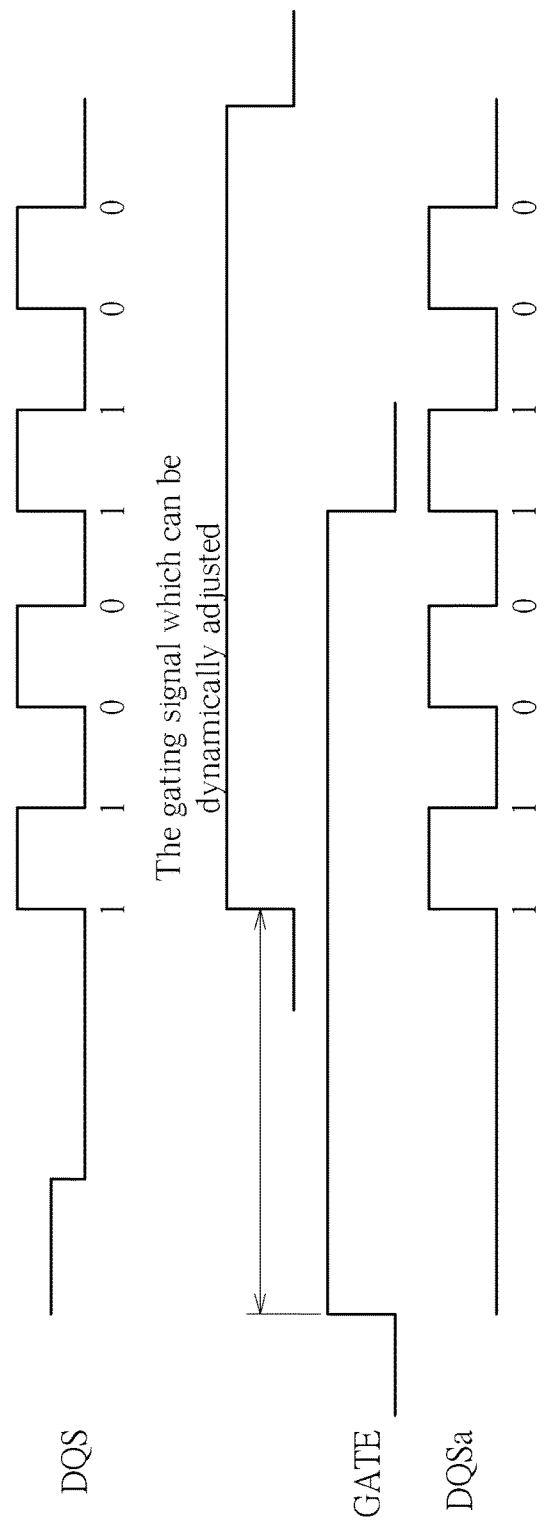
FIG. 6 is a diagram illustrating a preamble detection margin control scheme of the DDR gating method shown in FIG. 2 according to an embodiment of the present invention.

FIG. 6 is a diagram illustrating a preamble detection margin control scheme of the DDR gating method 200 shown in FIG. 2 according to an embodiment of the present invention, wherein the preamble detection margin control scheme may increase the detection margin of the preamble. For better understanding, the memory 50 may be DDR SDRAMs conforming to the LPDDR2 and LPDDR3. The preamble of the data strobe signal DQS shown in the top of FIG. 6 may be equivalent to the preamble of the data strobe signal DQS shown in the top-right corner of FIG. 4. According to some modifications of this embodiment, the memory 50 may be DDR SDRAMs conforming to the DDR4, the preamble of the data strobe signal DQS shown in the top of FIG. 6 may be replaced with the preamble of the data strobe signal DQS shown in the top-right corner of FIG. 3, and the data strobe signal DQSa may change correspondingly.

As shown in FIG. 6, the gating signal adjustment module may dynamically shift the gating signal GATE along the time axis for the gating module shown in FIG. 5. The two waveforms belonging to the gating signal GATE shown in FIG. 6 are examples of the gating signal GATE, to illustrate that the gating signal GATE can be dynamically shifted along the time axis. The gating signal GATE may be shifted to any location other than the two exemplary waveforms of the gating signal GATE, however. Since the gating signal adjustment module may dynamically shift the gating signal GATE, the length of the gate open time interval of the gating signal GATE (e.g. the time interval corresponding to the high level thereof) will become long enough to allow "an lengthened preamble and a portion of pulses following the preamble, and other portion of pulses" in the data strobe signal DQS to pass. According to the dynamically shifted gating signal GATE (especially the union of gate open time intervals of various waveforms of the gating signal GATE), the gating module may allow "the lengthened preamble, the portion of pulses following the preamble, and the other portion of pulses" to pass.

Figure 7:
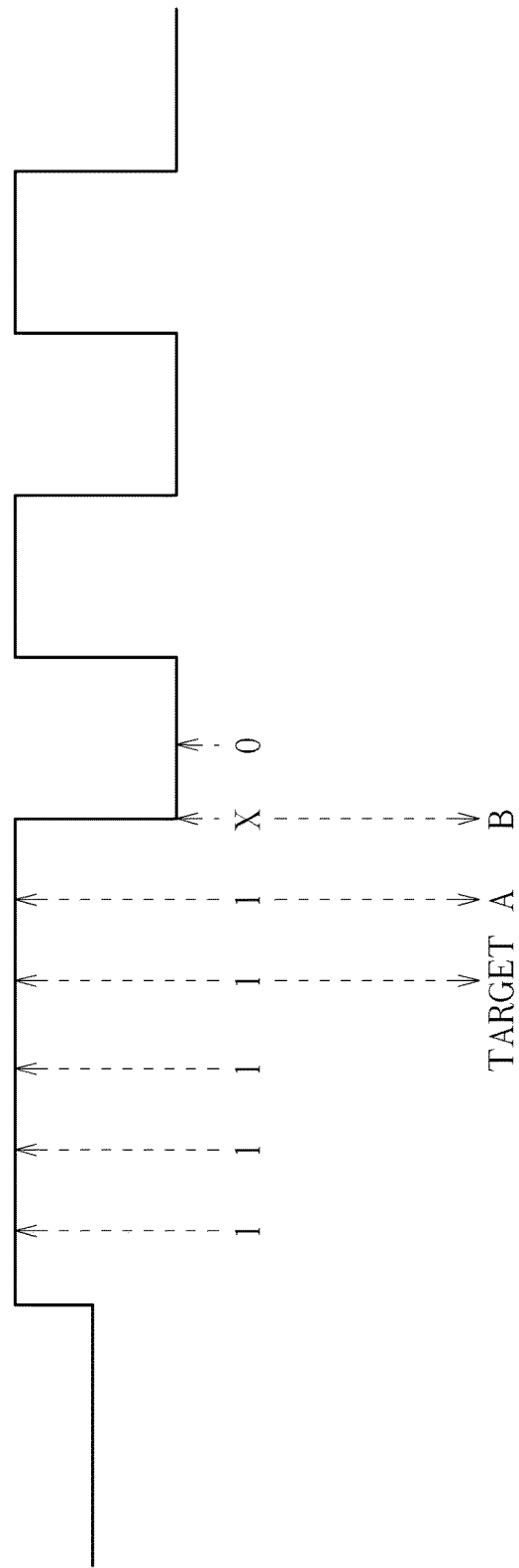
FIG. 7 is a diagram illustrating a real-time tracing control scheme of the DDR gating method shown in FIG. 2 according to an embodiment of the present invention.

FIG. 7 is a diagram illustrating a real-time tracing control scheme of the DDR gating method 200 shown in FIG. 2 according to an embodiment of the present invention. In FIG. 7, the upward arrows (which are depicted by dotted lines) may represent the plurality of candidate oversampling points mentioned in some previous embodiments, and the downward arrows (which are depicted by dotted lines) may represent the set of oversampling points mentioned in some embodiments, such as a set of oversampling points {TARGET, A, B}. The series of logic values shown in FIG. 7 (e.g. the logic values {1, 1, 1, 1, 1} and 0) may represent available logic values in the plurality of candidate oversampling points, wherein the symbol "X" may represent a sampling result which is not definitely correct, e.g. X may be the logic value 1 or 0. When performing the oversampling operation, the margin control circuit 120 may refer to the following predetermined rules to selectively update the set of oversampling points {TARGET, A, B}:

(1). If A=0 and B=0 (i.e. the sampling results of the oversampling points {A, B} are logic values {0, 0}), left shift each oversampling point within the set of oversampling points {TARGET, A, B} to a next sampling point (which may be considered as left shifting one grid);

(2). If A=0 and B=1 (i.e. the sampling results of the oversampling points {A, B} are logic values {0, 1}), left shift each oversampling point within the set of oversampling points {TARGET, A, B} to a next sampling point;

(3). If A=1 and B=0 (i.e. the sampling results of the oversampling points {A, B} are logic values {1, 0}), keep the locations of the set of oversampling points {TARGET, A, B}, rather than moving them; and (4). If A=1 and B=1 (i.e. the sampling results of the oversampling points {A, B} are logic values {1, 1}), right shift each oversampling point within the set of oversampling points {TARGET, A, B} to a next sampling point (which may be considered as right shifting one grid); wherein the margin control circuit 120 may refer to the order defined in the above predetermined rules to perform corresponding operations. This is merely for illustrative purposes; for example, the order of the above predetermined rules is modifiable.

In this embodiment, based on the predetermined rule (3), when the margin control circuit 120 keeps the locations of the set of oversampling points {TARGET, A, B} without moving them, it means the margin control circuit 120 has locked the first falling edge of the DQS signal. Hence, the margin control circuit 120 may real-time trace the first edge of the backward clock signal CKback (e.g. the DQS signal) after the preamble. More particularly, the real-time tracing control scheme shown in FIG. 7 may be applied to the gating signal adjustment module in the margin control circuit 120. According to at least one portion (e.g. one or more) of the predetermined rules (1), (2), (3) and (4), the gating signal adjustment module may dynamically shift gating signal GATE along the time axis, making the initial time of the gate open time interval align with the oversampling point TARGET for the gating module. For example, the gating signal adjustment module may be implemented with a logic circuit. Some features in this embodiment similar to those in the previous embodiments/modifications are omitted here for brevity.

Figure 8:
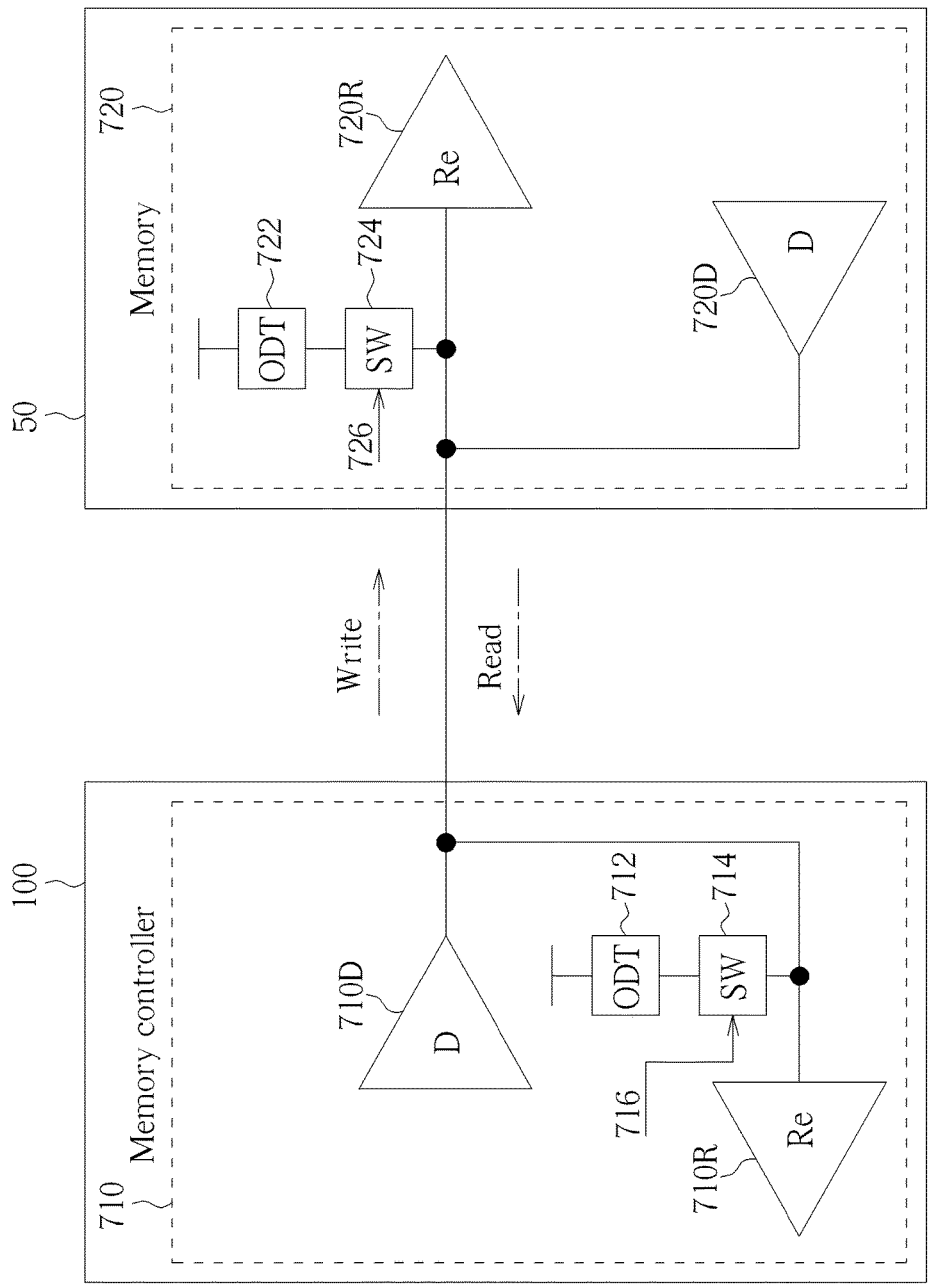
FIG. 8 is a diagram illustrating an input/output circuit and associated elements of the memory controller shown in FIG. 1 according to an embodiment of the present invention.

FIG. 8 is a diagram illustrating an input/output (I/O) circuit 710 and some associated elements of the memory controller 100 shown in FIG. 1 (such as the I/O circuit 720 located in the memory 50) according to an embodiment of the present invention. Note that at least one portion (e.g. part or all) of the I/O circuit 710 may be an example of the input stage mentioned in Step 220. A set of I/O circuits {710, 720} is depicted in FIG. 8. According to some embodiments, however, the memory controller 100 and the memory 50 may comprise at least a set of other I/O circuits, wherein the each set of other I/O circuits may be a copy of the set of I/O circuits {710, 720}. As shown in FIG. 8, the I/O circuit 710 may comprise a driver 710D, a receiver 710R, an ODT resistor 712 and a switching unit 714 (for brevity, these elements are marked with the symbols "D," "Re," "ODT" and "SW" in FIG. 8), wherein the switching unit 714 performs switching according to a switching control signal 716, to selectively enable the signal path between the ODT resistor 712 and the receiver 710R. The I/O circuit 720 may comprise a driver 720D, a receiver 720R, an ODT resistor 722 and a switching unit 724 (for brevity, these elements are marked with the symbols "D," "Re," "ODT" and "SW" in FIG. 8), wherein the switching unit 724 performs switching according to a switching control signal 726, to selectively enable the signal path between the ODT resistor 722 and the receiver 720R.

When the set of I/O circuits {710, 720} is arranged to transmit writing data to a set of I/O circuits of the memory 50 from the memory controller 100, the driver 710D may be arranged to output a series of bit information to the memory 50, and the receiver 720R may be arranged to input a series of bit information from the memory controller 100. In another example, when the set of I/O circuits {720, 710} is arranged to transmit reading data to a set of I/O circuits of the memory controller 100 from the memory 50, the driver 720D may be arranged to output a series of bit information to the memory controller 100, and the receiver 710R may be arranged to input the series of bit information from the series of bit information of the memory 50. This is for illustrative purposes, rather than a limitation of the present invention. When the set of I/O circuits {710, 720} is arranged to transmit the outward clock signal CKout to a set of I/O circuits of the memory 50 from the memory controller 100, the driver 710D may be arranged to output a series of pulses to the memory 50, and the receiver 720R may be arranged to input the series of pulses from the memory controller 100. In another example, when the set of I/O circuits {720, 710} is arranged to transmit the backward clock signal CKback to a set of I/O circuits of the memory controller 100 from the memory 50, the driver 720D may be arranged to output a series of pulses to the memory controller 100, and the receiver 710R may be arranged to input the series of pulses from the memory 50. In this situation, the ODT resistor 712 may be an example of the ODT resistor mentioned in the embodiment of FIG. 3. Some features in this embodiment similar to those in the previous embodiments/modifications are omitted here for brevity.

According to some embodiments, the ODT resistor 712 may be an example of the pull up resistor mentioned in the embodiment shown in FIG. 4, wherein the coupling of the pull up resistor may be identical to that of the ODT resistor 712, and the coupling of the pull down resistor may be similar to that of the ODT resistor 712. The signal path where the pull down resistor is located is selectively coupled to a local ground of the receiver 710R (e.g. the low level state in FIG. 4), rather than any high level (e.g. the high level state in FIG. 4). For example, the I/O circuit 710 may comprise another switching unit, and the other switching unit is coupled between the receiver 710R and the pull down resistor. The other switching unit may perform switching according to another switching control signal (e.g. an inverted signal of the switching control signal 716), to selectively enable the signal path between the receiver 710R and the pull down resistor. More particularly, when the other switching unit enables the signal path between the receiver 710R and the pull down resistor, the receiver 710R is coupled to the local ground through the signal path. For brevity, some features in this embodiment similar to those in the previous embodiments/modifications are omitted here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A double data rate (DDR) gating method applied to a memory controller, the DDR gating method comprising:
   outputting an outward clock signal to a memory from the memory controller, and receiving a backward clock signal corresponding to the outward clock signal from the memory, wherein the backward clock signal is utilized as reference for a data reading operation of the memory controller with respect to the memory; and
   providing a reference signal to an input stage of the memory controller to generate gating-related information through single ended receiving of the input stage for performing gating when sampling the backward clock signal, and lengthening a preamble of the backward clock signal with aid of the single ended receiving of the input stage for increasing a detection margin of the preamble;
   wherein the backward clock signal from the memory is implemented as a set of differential data strobe signals, and the memory controller obtains a received data strobe signal through differential receiving, wherein the operation of sampling the backward clock signal is implemented by sampling the received data strobe signal; and the memory controller obtains another received data strobe signal through the single ended receiving of the input stage, wherein the other received data strobe signal carries the gating-related information.

2. The DDR gating method of claim 1, further comprising:
   generating at least one gating signal to increase the detection margin of the preamble.

3. The DDR gating method of claim 2, further comprising:
performing gating upon the backward clock signal according to the gating signal to generate a filtered backward clock signal as reference for the data reading operation.

4. The DDR gating method of claim 3, wherein the step of perform gating upon the backward clock signal according to the gating signal to generate the filtered backward clock signal further comprises:
performing gating upon the backward clock signal according to the gating signal, to prevent any unknown state within a plurality of logic states of the backward clock signal from occurring in the filtered backward clock signal.

5. The DDR gating method of claim 3, further comprising:
when performing the data reading operation, sampling a data signal from the memory according to the filtered backward clock signal to obtain data.

6. The DDR gating method of claim 1, further comprising:
performing at least one oversampling operation upon the backward clock signal to trace a first edge of the backward clock signal after the preamble in order to perform real-time tracing upon the backward clock signal.

7. The DDR gating method of claim 6, wherein the step of performing at least one oversampling operation upon the backward clock signal to trace the first edge of the backward clock signal after the preamble further comprises:
selecting a set of oversampling points from a plurality of candidate oversampling points, wherein the set of oversampling points is a plurality of successive oversampling points within the plurality of candidate oversampling points;
performing a set of oversampling operations corresponding to the set of oversampling points, respectively, to obtain a set of sampling results corresponding to the set of oversampling points, respectively; and
selectively updating the set of oversampling points according to the set of sampling results.

8. The DDR gating method of claim 7, wherein the set of oversampling points comprises a target oversampling point and at least two subsequent oversampling points, and the target oversampling point is arranged to lock the first edge of the backward clock signal after the preamble.

9. The DDR gating method of claim 1, further comprising:
performing at least one oversampling operation upon the backward clock signal to trace a first edge of the backward clock signal after the preamble, rather than locking the backward clock signal with any dummy input/output (I/O) cell.

10. A double data rate (DDR) gating apparatus, the DDR gating apparatus comprising at least one portion of an electronic device, the DDR gating apparatus comprising:
a memory controller, arranged to control a memory, wherein the memory controller and the memory are installed in an electronic device, and the memory controller comprises:
an input stage, arranged to receive at least one signal;
an access control circuit, coupled to the input stage, arranged to output an outward clock signal to a memory from the memory controller, wherein the access control circuit controls the input stage to receive a backward clock signal corresponding to the outward clock signal from the memory, and the backward clock signal is used as reference for a data reading operation of the memory controller upon the memory; and a margin control circuit, coupled to the input stage and the access control circuit, arranged to provide a reference signal to the input stage to generate gating-related information through single ended receiving of the input stage for performing gating when sampling the backward clock signal, and lengthening a preamble of the backward clock signal with aid of the single ended receiving of the input stage for increasing a detection margin of the preamble;
wherein the backward clock signal from the memory is implemented as a set of differential data strobe signals, and the memory controller obtains a received data strobe signal through differential receiving, wherein the operation of sampling the backward clock signal is implemented by sampling the received data strobe signal; and the memory controller obtains another received data strobe signal through the single ended receiving of the input stage, wherein the other received data strobe signal carries the gating-related information.

11. The DDR gating apparatus of claim 10, wherein the margin control circuit generates at least one gating signal to increase the detection margin of the preamble.

12. The DDR gating apparatus of claim 11, wherein according to the gating signal, the margin control circuit performs gating upon the backward clock signal to generate a filtered backward clock signal as reference for the data reading operation.

13. The DDR gating apparatus of claim 12, wherein according to the gating signal, the margin control circuit performs gating upon the backward clock signal to prevent any unknown state within a plurality of logic states of the backward clock signal from occurring in the filtered backward clock signal.

14. The DDR gating apparatus of claim 12, wherein when performing the data reading operation, the memory controller samples a data signal from the memory according to the filtered backward clock signal to obtain data.

15. The DDR gating apparatus of claim 10, wherein the margin control circuit performs at least one oversampling operation upon the backward clock signal to trace a first edge of the backward clock signal after the preamble in order to perform real-time tracing upon the backward clock signal.

16. The DDR gating apparatus of claim 15, wherein the margin control circuit selects a set of oversampling points from a plurality of candidate oversampling points, wherein the set of oversampling points is a plurality of successive oversampling points within the plurality of candidate oversampling points; the margin control circuit performs a set of oversampling operations corresponding to the set of oversampling points, respectively, to obtain a set of sampling results corresponding to the set of oversampling points, respectively; and the margin control circuit selectively updates the set of oversampling points according to the set of sampling results.

17. The DDR gating apparatus of claim 16, wherein the set of oversampling points comprises a target oversampling point and at least two subsequent oversampling points, and the target oversampling point is arranged to lock the first edge of the backward clock signal after the preamble.

18. The DDR gating apparatus of claim 10, wherein the margin control circuit performs at least one oversampling operation upon the backward clock signal to trace a first edge of the backward clock signal after the preamble, rather than locking the backward clock signal with any dummy input/output (I/O) cell.

* * * * *